United States Patent
Liu et al.

(10) Patent No.: US 12,040,413 B2
(45) Date of Patent: Jul. 16, 2024

(54) SEMI-FLOATING GATE MEMORY DEVICE AND METHOD FOR FABRICATING THE SAME

(71) Applicant: Shanghai Huali Integrated Circuit Corporation, Shanghai (CN)

(72) Inventors: Heng Liu, Shanghai (CN); Zhigang Yang, Shanghai (CN); Jianghua Leng, Shanghai (CN); Tianpeng Guan, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 0 days.

(21) Appl. No.: 17/953,855

(22) Filed: Sep. 27, 2022

(65) Prior Publication Data

US 2023/0146733 A1    May 11, 2023

(30) Foreign Application Priority Data

Nov. 9, 2021    (CN) .......................... 202111319362.3

(51) Int. Cl.
| | |
|---|---|
| *H01L 29/788* | (2006.01) |
| *H01L 21/28* | (2006.01) |
| *H01L 29/423* | (2006.01) |
| *H01L 29/66* | (2006.01) |

(52) U.S. Cl.
CPC .... *H01L 29/7885* (2013.01); *H01L 29/40114* (2019.08); *H01L 29/42336* (2013.01); *H01L 29/66825* (2013.01)

(58) Field of Classification Search
None
See application file for complete search history.

(56) References Cited

U.S. PATENT DOCUMENTS

| | | | | |
|---|---|---|---|---|
| 5,991,204 | A | * 11/1999 | Chang | H10B 41/40 257/E27.081 |
| 2005/0112834 | A1 | * 5/2005 | Jin | H01L 29/6656 438/303 |
| 2018/0090626 | A1 | * 3/2018 | Yamashita | H01L 29/66795 |

OTHER PUBLICATIONS

English translation of CN-110416085-A (Year: 2019).*

* cited by examiner

*Primary Examiner* — Xiaoming Liu
(74) *Attorney, Agent, or Firm* — Banner & Witcoff, Ltd.

(57) ABSTRACT

The present application discloses a semi-floating gate memory device, which is a double control gate semi-floating gate memory device with a high-K/metal gate and a silicon oxide/polysilicon gate. A control gate epitaxial silicon layer, a source region and a drain region are formed by an epitaxial growth structure, separate source and drain ion implantation is not needed, the mask required for source and drain ion implantation is saved, and the fabrication cost is low. The present application further discloses a method for fabricating the semi-floating gate memory device.

10 Claims, 8 Drawing Sheets

SEMI-FLOATING GATE MEMORY DEVICE AND METHOD FOR FABRICATING THE SAME

CROSS-REFERENCE TO RELATED APPLICATIONS

This application claims the priority to Chinese Patent Application No. 202111319362.3, filed on Nov. 9, 2021, the disclosure of which is incorporated herein by reference in its entirety.

TECHNICAL FIELD

The present application relates to integrated circuit manufacturing technology, in particular to a semi-floating gate memory device and a method for fabricating the same.

BACKGROUND

With the continuous reduction of the size of the semiconductor device to 28 nm and below-28 nm process nodes, the thickness of the transistor gate dielectric layer SiON is reduced to less than 2 nm, resulting in the increase of leakage current of the transistor device. The semiconductor industry uses high-K (dielectric constant) dielectric material $HfO_2$ to replace SiON as the gate oxide layer to reduce the quantum tunneling effect of the gate dielectric layer, so as to effectively improve the transistor gate leakage current and the power consumption caused thereby.

The semi-floating gate memory device is an alternative concept of Dynamic Random Access Memory (DRAM), which is different from the usual 1T1C structure. The semi-floating gate memory device is composed of a floating gate transistor, an embedded tunneling transistor and a PN junction. The floating gate of the floating gate transistor is subjected to writing-in and erasing operations through the channel of the embedded tunneling transistor and the PN junction. Also, the oxide/polysilicon gate of the control gate is replaced with a high-K/metal gate to reduce the gate leakage.

Figure 1:
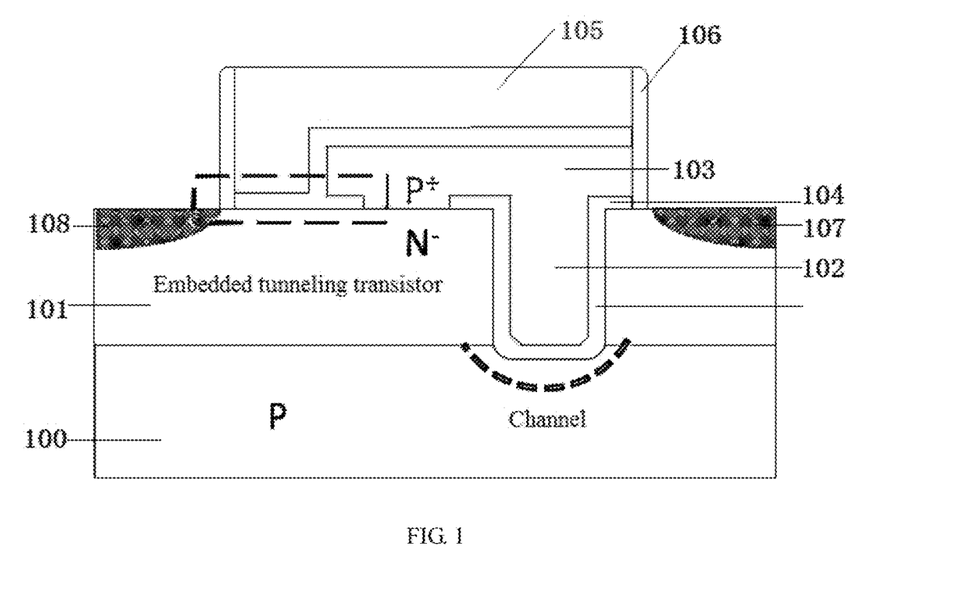
FIG. 1 illustrates a schematic diagram of a structure of an existing semi-floating gate memory device.

The structure of an existing semi-floating gate memory device is as illustrated in FIG. 1. A semi-floating gate well region 101 of a second doping type is formed on a silicon substrate 100 of a first doping type. A U-shaped groove 102 connected to the silicon substrate 100 is formed in the semi-floating gate well region 101.

A floating gate polysilicon layer 103 is filled into the U-shaped groove 102 and above the semi-floating gate well region 101 covering the periphery of the U-shaped groove 102.

The floating gate polysilicon layer 103 filled into the U-shaped groove 102 is isolated from the semi-floating gate well region 101 by a floating gate dielectric layer 104;

The floating gate polysilicon layer 103 above the semi-floating gate well region 101 covering the periphery of the U-shaped groove 102 is isolated from an upper surface of the semi-floating gate well region 101 by a floating gate dielectric layer 104, and is in connective contact with the semi-floating gate well region 101 through an opening in the floating gate dielectric layer 104 covering the upper surface of the semi-floating gate well region 101 on a left side of the U-shaped groove 102.

The floating gate dielectric layer 104 and the floating gate polysilicon layer 103 jointly form a floating gate stack layer.

A control gate polysilicon 105 is located on the floating gate polysilicon layer 103 and downwards extends from a left side of the floating gate polysilicon layer 103 to the top of the semi-floating gate well region 101. The control gate polysilicon 105 is isolated from the floating gate polysilicon layer 103 and the semi-floating gate well region 101 by a dielectric layer.

Spacer 106 is respectively formed on a left side of the downwards extending part of the control gate polysilicon 105, the control gate polysilicon 105 and a right side of the floating gate polysilicon layer 103.

Ions are implanted into the semi-floating gate well region 101 on the left side of the left spacer and the right side of the right spacer to respectively form a source region 107 and a drain region 108.

For the existing semi-floating gate storage devices, source and drain ion implantation requires a separate mask, so the cost is high.

BRIEF SUMMARY

The technical problem to be solved by the present application is to provide a semi-floating gate transistor and a method for fabricating the same. It has an epitaxial growth structure, can save the mask required for source and drain ion implantation, and is low in fabrication cost.

In order to solve the technical problem, the present application provides a semi-floating gate memory device, a semi-floating gate well region 101 of a second doping type being formed on a silicon substrate 100 of a first doping type, the first doping type being P-type and the second doping type being N-type, or the first doping type being N-type and the second doping type being P-type, wherein a U-shaped groove 102 connected to the silicon substrate 100 is formed in the semi-floating gate well region 101;

a floating gate polysilicon layer 103 of the first doping type is filled into the U-shaped groove 102 and above the semi-floating gate well region 101 covering the periphery of the U-shaped groove 102;

the floating gate polysilicon layer 103 filled into the U-shaped groove 102 is isolated from the semi-floating gate well region 101 by a floating gate dielectric layer 104;

the floating gate polysilicon layer 103 above the semi-floating gate well region 101 covering the periphery of the U-shaped groove 102 is isolated from an upper surface of the semi-floating gate well region 101 by a floating gate dielectric layer 104, and is in connective contact with the semi-floating gate well region 101 through an opening in the floating gate dielectric layer 104 covering the upper surface of the semi-floating gate well region 101 on a left side of the U-shaped groove 102;

a control gate oxide layer 110 covers an upper surface of the floating gate polysilicon layer 103;

a control gate polysilicon layer 111 covers an upper surface of the control gate oxide layer 110;

a metal gate 113 is located on a left part of the control gate polysilicon layer 111 and downwards extends from a left side of the control gate polysilicon layer 111 to an upper part of the semi-floating gate well region 101, and the metal gate 113 is isolated from the control gate polysilicon layer 111 and the semi-floating gate well region 101 by a high-K dielectric layer 112;

spacer 106 is formed on the left side of the downwards extending part of the metal gate 113, the right side of the part of the metal gate 113 above the control gate polysilicon layer 111, the right side of the control gate polysilicon layer 111, and the right side of the floating gate polysilicon layer 103;

a source region 107 and a drain region 108 are respectively formed through silicon epitaxial growth on the semi-floating gate well region 101 outside the left spacer of the metal gate 113 and the semi-floating gate well region 101 outside the right spacer of the control gate polysilicon layer 111;

a control gate epitaxial silicon layer 114 is formed through silicon epitaxial growth on the control gate polysilicon layer 111.

Further, the control gate epitaxial silicon layer 114 is lower than an upper surface of the metal gate 113.

Further, the width of the metal gate 113 downwards extending to the top of the semi-floating gate well region 101 is 1-100 nm;

the width of the metal gate 113 covering the control gate polysilicon layer 111 is 1-100 nm.

Further, the width of the control gate polysilicon layer 111 not covered by the metal gate 113 is 1-100 nm;

the regional width of the control gate epitaxial silicon layer 114 is 1-100 nm;

the width of the source region 107 and the drain region 108 formed through silicon epitaxial growth is 1-100 nm.

Further, the high-K gate dielectric layer 112 is one or a combination of any of $ZrO_2$, ZrON, ZrSiON, HfZrO, HfZrON, HfON, $HfO_2$, HfAlO, HfAlON, HfSiO, HfSiON, HfLaO and HfLaON;

the metal gate 113 is one or a combination of any of TiN, TaN, MON, WN, TaC and TaCN.

In order to solve the technical problem, the present application provides a method for preparing a semi-floating gate memory device, which includes the following steps:

S1: forming a semi-floating gate well region 101 of a second doping type on a silicon substrate 100 of a first doping type, and etching the semi-floating gate well region 101 to form a U-shaped groove 102 connected to the silicon substrate 100, the first doping type being P-type and the second doping type being N-type, or the first doping type being N-type and the second doping type being P-type;

S2: forming a floating gate dielectric layer 104 on a surface of the U-shaped groove 102 and an upper surface of the semi-floating gate well region 101;

S3: etching the floating gate dielectric layer 104, forming an opening 105 connected to the semi-floating gate well region 101 on the floating gate dielectric layer 104 on a left side of the U-shaped groove 103, and exposing a part of the semi-floating gate well region 101;

S4: depositing a floating gate polysilicon layer 103, performing a first doping type ion implantation and performing annealing for activation;

S5: depositing a control gate oxide layer 110 and a control gate polysilicon layer 111 on the floating gate polysilicon 103;

S6: performing etching to remove a vertical stack layer of the control gate polysilicon layer 111, the control gate oxide layer 110, the floating gate polysilicon layer 103 and the floating gate dielectric layer 104 outside a first set distance on the left side of the opening, and stopping at the semi-floating gate well region 101;

S7: forming a high-K dielectric layer 112 on a wafer;

S8: depositing a metal gate 113 on the high-K dielectric layer 112;

S9: performing metal gate 113 chemical-mechanical polishing;

S10: performing etching to remove a vertical stack layer of the metal gate 113 and the high-K dielectric layer 112 outside a second set distance on the left side of the opening, and stopping at the semi-floating gate well region 101, the second set distance being greater than the first set distance; and performing etching to remove a vertical stack layer of the metal gate 113 and the high-K dielectric layer 112 on a right side of a left part of the opening, and stopping at the control gate polysilicon layer 111;

S11: performing etching to remove a vertical stack layer of the control gate polysilicon layer 111, the control gate oxide layer 110, the floating gate polysilicon 103 and the floating gate dielectric layer 104 outside a third set distance on a right side of the U-shaped groove 102, and stopping at the semi-floating gate well region 101 to form a complete polysilicon control gate;

S12: forming gate spacer 106;

S13: simultaneously performing silicon epitaxial growth on the control gate polysilicon layer 111, the semi-floating gate well region 101 outside the left spacer of the metal gate 113 and the semi-floating gate well region 101 outside the right spacer of the control gate polysilicon layer 111 to respectively form a control gate epitaxial silicon layer 114, a source region 107 and a drain region 108.

Further, in step S9, when the metal gate 113 chemical-mechanical polishing is performed, the stopped metal gate 113 is higher than the high-K dielectric layer 112.

Further, in step S9, when the metal gate 113 chemical-mechanical polishing is performed, the stopped metal gate 113 is 0.1 nm-50 nm higher than the high-K dielectric layer 112.

Further, in step S10, the second set distance is 1-100 nm larger than the first set distance, that is, the width of the metal gate 113 downwards extending to the top of the semi-floating gate well region 101 is 1-100 nm.

Further, after etching is performed to remove a vertical stack layer of the metal gate 113 and the high-K dielectric layer 112 on a right side of a left part of the opening, the width of the metal gate 113 covering the control gate polysilicon layer 111 is 1-100 nm.

Further, in step S11, after etching is performed to remove a vertical stack layer of the control gate polysilicon layer 111, the control gate oxide layer 110, the floating gate polysilicon 103 and the floating gate dielectric layer 104 outside a third set distance on the right side of the U-shaped groove 102, the width of the control gate polysilicon layer 111 not covered by the metal gate 113 is 1-100 nm.

Further, the high-K gate dielectric layer 112 is one or a combination of any of $ZrO_2$, ZrON, ZrSiON, HfZrO, HfZrON, HfON, $HfO_2$, HfAlO, HfAlON, HfSiO, HfSiON, HfLaO and HfLaON;

the metal gate 113 is one or a combination of any of TiN, TaN, MON, WN, TaC and TaCN.

For the semi-floating gate memory device and the method for fabricating the same provided by the present application, the semi-floating gate memory device is a double control gate semi-floating gate memory device with a high-K/metal gate and a silicon oxide/polysilicon gate. A control gate epitaxial silicon layer 114, a source region 107 and a drain region 108 are formed by an epitaxial growth structure, separate source and drain ion implantation is not needed, the mask required for source and drain ion implantation is saved, and the fabrication cost is low.

BRIEF DESCRIPTION OF THE DRAWINGS

In order to more clearly describe the technical solution of the present application, the following will briefly introduce the drawings needed in the present application. It is obvious that the drawings in the following description are only some embodiments of the present application. For those skilled in the art, other drawings can be obtained according to these drawings without contributing any inventive labor.

DETAILED DESCRIPTION

The technical solution of the present application will be clearly and completely described below with reference to the drawings. Obviously, the described embodiments are part of the embodiments of the present application, instead of all of them. Based on the embodiments in the present application, all other embodiments obtained by those skilled in the art without contributing any inventive labor still fall within the scope of protection of the present application.

Embodiment 1

Figure 13:
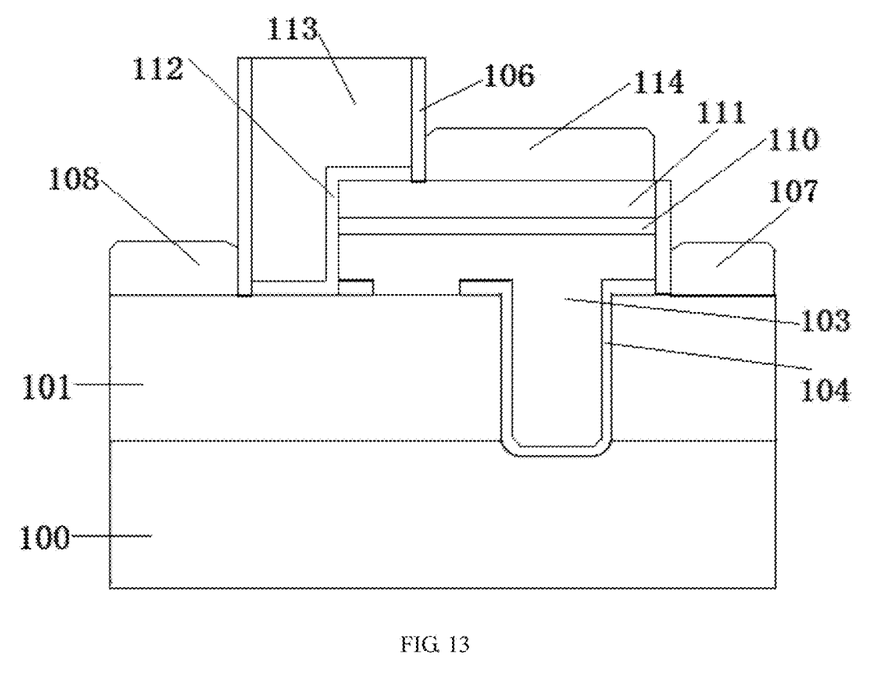
FIG. 13 illustrates a schematic diagram after performing silicon epitaxial growth to respectively form a control gate epitaxial silicon layer, a source region and a drain region in a method for fabricating a semi-floating gate memory device according to an embodiment of the present application.

A semi-floating gate memory device is provided. Referring to FIG. 13, a semi-floating gate well region 101 of a second doping type is formed on a silicon substrate 100 of a first doping type. The first doping type is P-type and the second doping type is N-type, or the first doping type is N-type and the second doping type is P-type.

A U-shaped groove 102 connected to the silicon substrate 100 is formed in the semi-floating gate well region 101.

A floating gate polysilicon layer 103 of the first doping type is filled into the U-shaped groove 102 and above the semi-floating gate well region 101 covering the periphery of the U-shaped groove 102.

The floating gate polysilicon layer 103 filled into the U-shaped groove 102 is isolated from the semi-floating gate well region 101 by a floating gate dielectric layer 104.

The floating gate polysilicon layer 103 above the semi-floating gate well region 101 covering the periphery of the U-shaped groove 102 is isolated from an upper surface of the semi-floating gate well region 101 by a floating gate dielectric layer 104, and is in connective contact with the semi-floating gate well region 101 through an opening in the floating gate dielectric layer 104 covering the upper surface of the semi-floating gate well region 101 on a left side of the U-shaped groove 102.

A control gate oxide layer 110 covers an upper surface of the floating gate polysilicon layer 103.

A control gate polysilicon layer 111 covers an upper surface of the control gate oxide layer 110.

A metal gate 113 is located on a left part of the control gate polysilicon layer 111 and downwards extends from a left side of the control gate polysilicon layer 111 to the top of the semi-floating gate well region 101, and the metal gate 113 is isolated from the control gate polysilicon layer 111 and the semi-floating gate well region 101 by a high-K dielectric layer 112.

Spacer 106 is formed on the left side of the downwards extending part of the metal gate 113, the right side of the part of the metal gate 113 above the control gate polysilicon layer 111, the right side of the control gate polysilicon layer 111, and the right side of the floating gate polysilicon layer 103.

A source region 107 and a drain region 108 are respectively formed through silicon epitaxial growth on the semi-floating gate well region 101 outside the left spacer of the metal gate 113 and the semi-floating gate well region 101 outside the right spacer of the control gate polysilicon layer 111.

A control gate epitaxial silicon layer 114 is formed through silicon epitaxial growth on the control gate polysilicon layer 111.

The semi-floating gate memory device according to embodiment 1 is a double control gate semi-floating gate memory device with a high-K/metal gate and a silicon oxide/polysilicon gate. A control gate epitaxial silicon layer 114, a source region 107 and a drain region 108 are formed by an epitaxial growth structure, separate source and drain ion implantation is not needed, the mask required for source and drain ion implantation is saved, and the fabrication cost is low.

Embodiment 2

Based on the semi-floating gate memory device according to embodiment 1, the control gate epitaxial silicon layer 114 is lower than an upper surface of the metal gate 113.

Further, the width of the metal gate 113 downwards extending to the top of the semi-floating gate well region 101 is 1-100 nm;

Further, the width of the metal gate 113 covering the control gate polysilicon layer 111 is 1-100 nm.

Further, the width of the control gate polysilicon layer 111 not covered by the metal gate 113 is 1-100 nm, the regional width of the control gate epitaxial silicon layer 114 is 1-100 nm, and the width of the source region 107 and the drain region 108 formed through silicon epitaxial growth is 1-100 nm, so that a conducting wire can be led out for control.

Further, the high-K gate dielectric layer 112 is one or a combination of any of $ZrO_2$, ZrON, ZrSiON, HfZrO, HfZrON, HfON, $HfO_2$, HfAlO, HfAlON, HfSiO, HfSiON, HfLaO and HfLaON.

Further, the metal gate 113 is one or a combination of any of TiN, TaN, MON, WN, TaC and TaCN.

Embodiment 3

Figure 2:
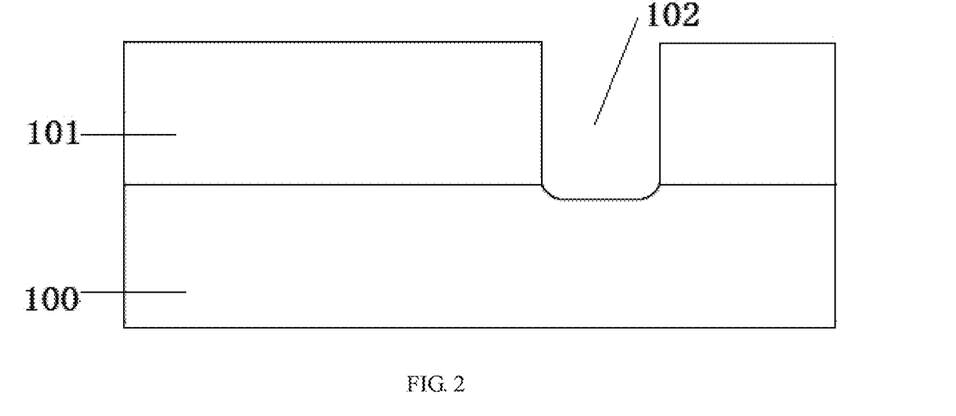
FIG. 2 illustrates a schematic diagram after forming a semi-floating gate well region in a method for fabricating a semi-floating gate memory device according to an embodiment of the present application.
Figure 3:
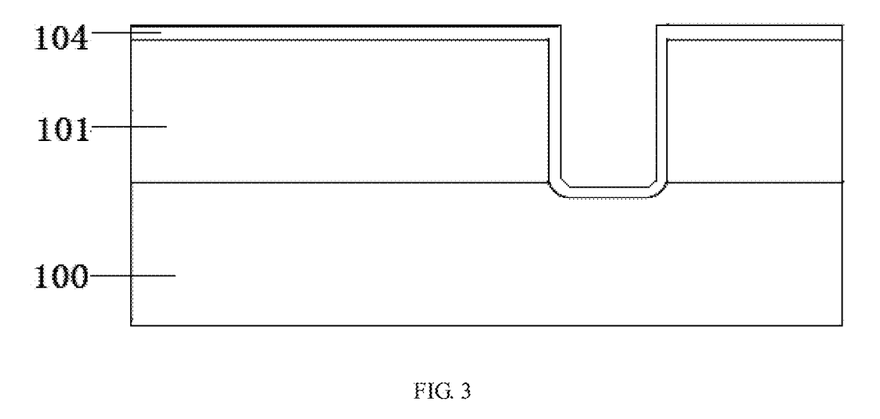
FIG. 3 illustrates a schematic diagram after forming a floating gate dielectric layer in a method for fabricating a semi-floating gate memory device according to an embodiment of the present application.
Figure 4:
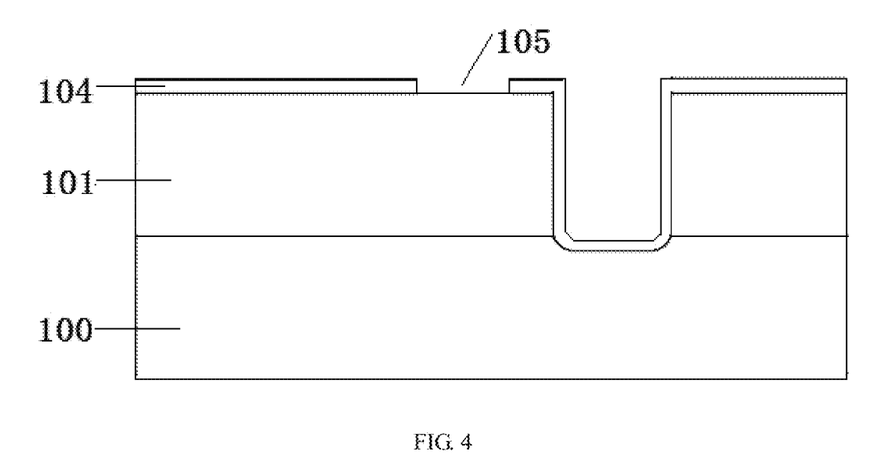
FIG. 4 illustrates a schematic diagram after etching a floating gate dielectric layer to expose part of a semi-floating gate well region in a method for fabricating a semi-floating gate memory device according to an embodiment of the present application.
Figure 5:
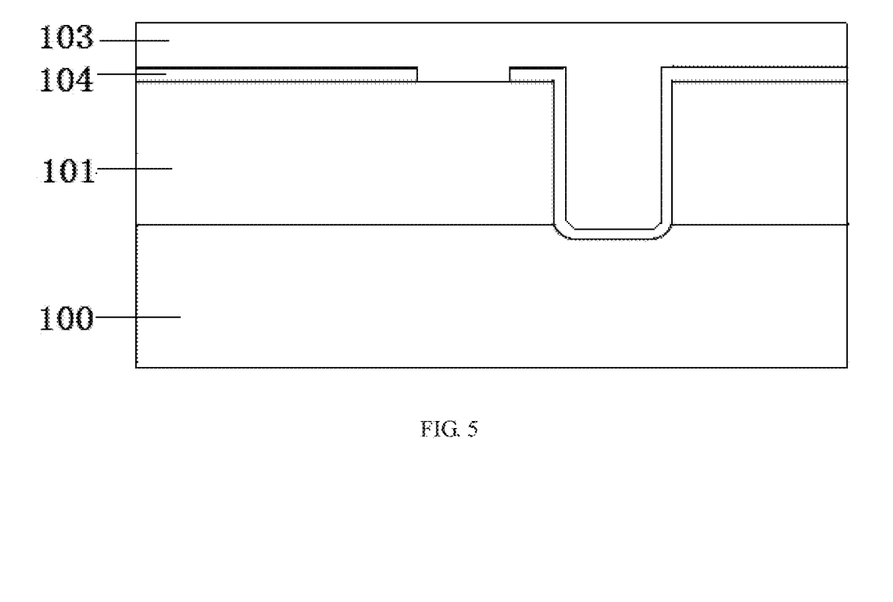
FIG. 5 illustrates a schematic diagram after depositing a floating gate polysilicon layer in a method for fabricating a semi-floating gate memory device according to an embodiment of the present application.
Figure 6:
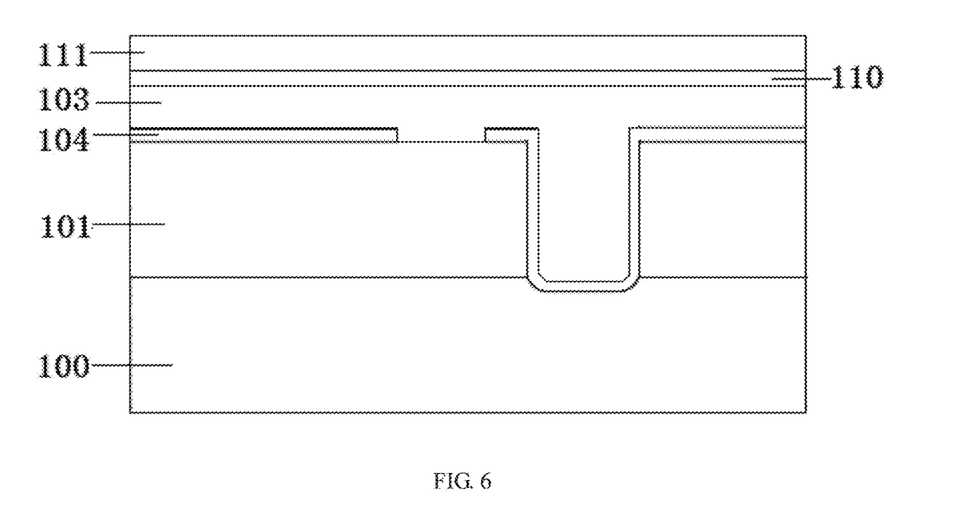
FIG. 6 illustrates a schematic diagram after depositing a control gate oxide layer and a control gate polysilicon layer in a method for fabricating a semi-floating gate memory device according to an embodiment of the present application.
Figure 7:
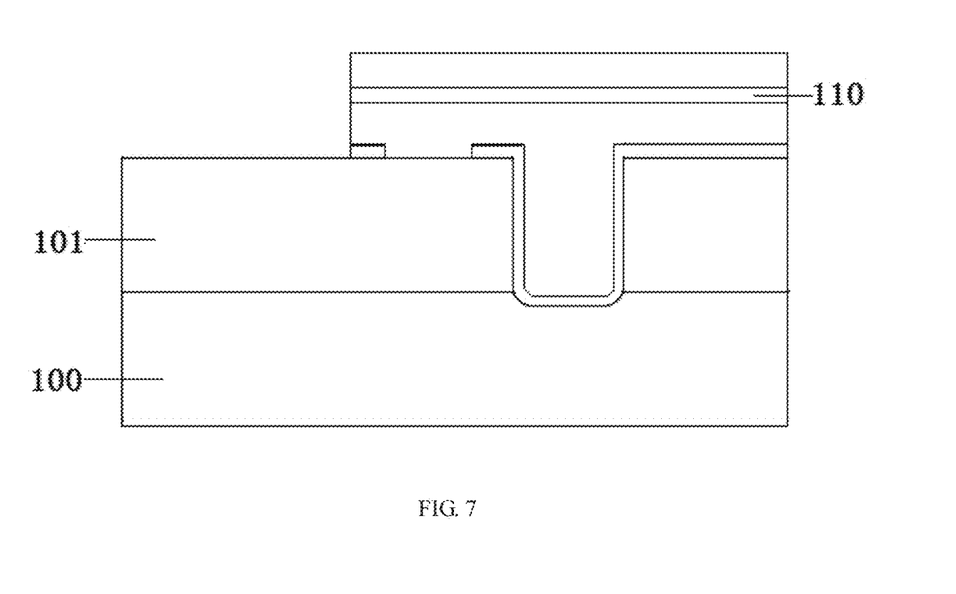
FIG. 7 illustrates a schematic diagram after performing etching to remove a vertical stack layer of a control gate polysilicon layer, a control gate oxide layer, a floating gate polysilicon layer and a floating gate dielectric layer in a method for fabricating a semi-floating gate memory device according to an embodiment of the present application.
Figure 8:
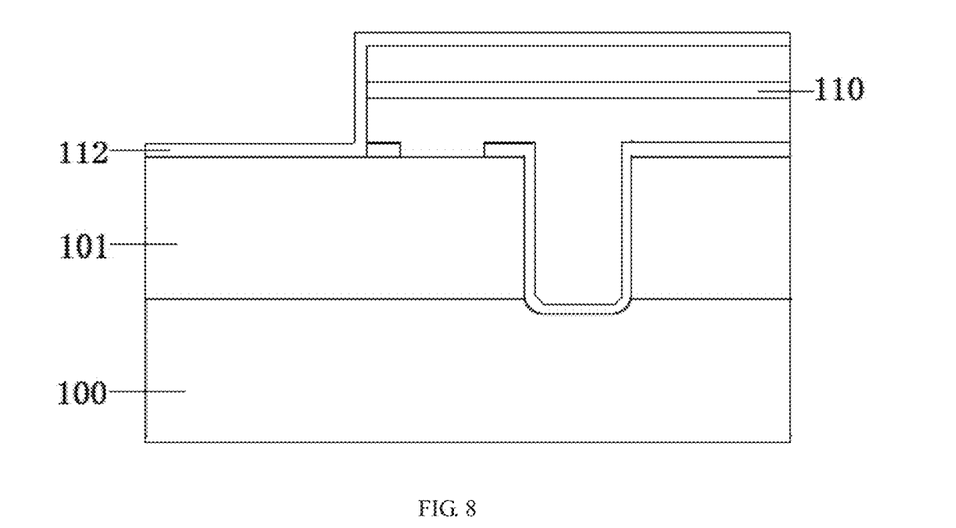
FIG. 8 illustrates a schematic diagram after forming a high-K dielectric layer in a method for fabricating a semi-floating gate memory device according to an embodiment of the present application.
Figure 9:
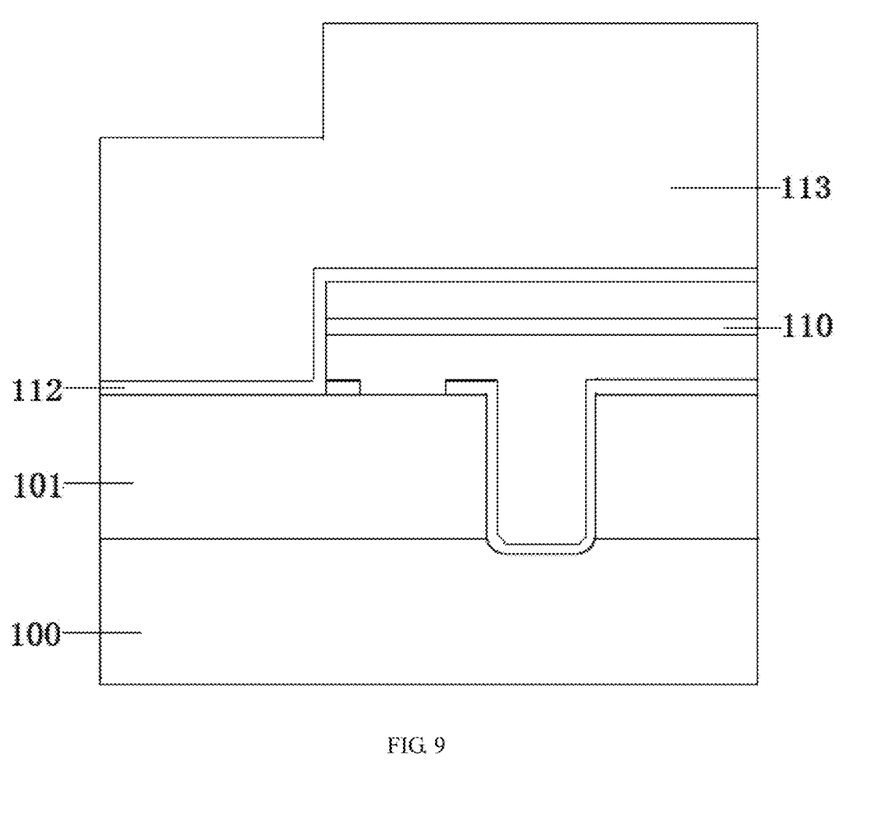
FIG. 9 illustrates a schematic diagram after depositing a metal gate in a method for fabricating a semi-floating gate memory device according to an embodiment of the present application.
Figure 10:
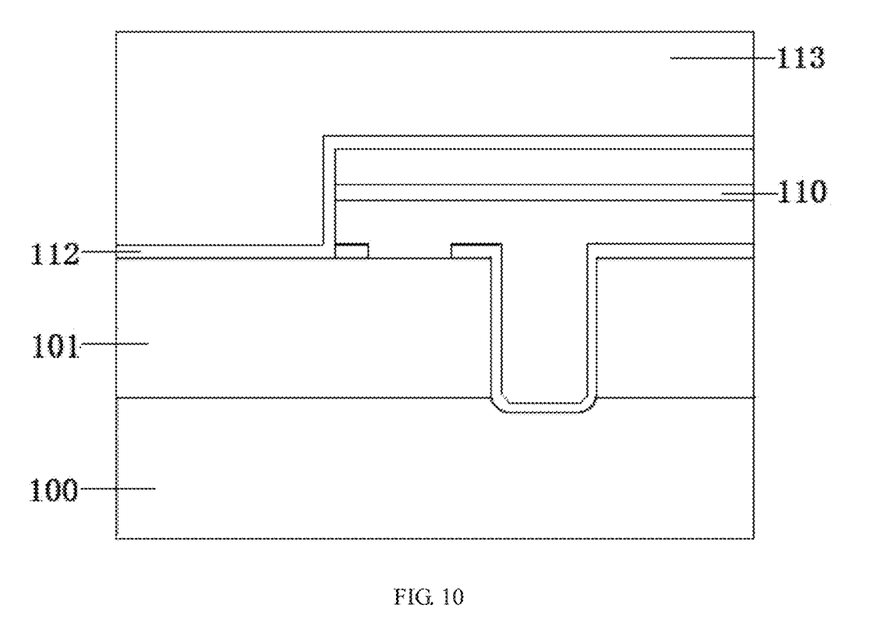
FIG. 10 illustrates a schematic diagram after performing metal gate chemical-mechanical polishing in a method for fabricating a semi-floating gate memory device according to an embodiment of the present application.
Figure 11:
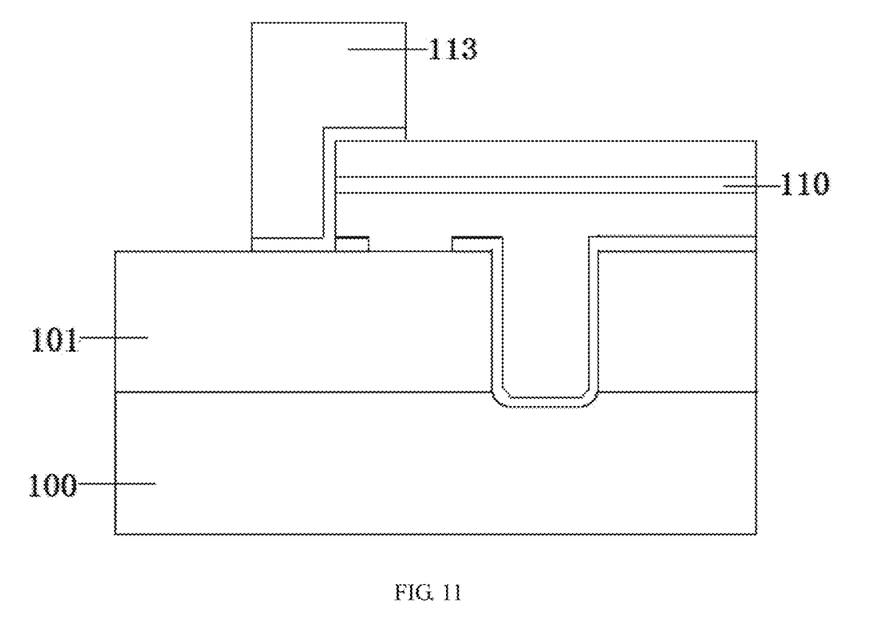
FIG. 11 illustrates a schematic diagram after performing etching to remove a vertical stack layer of a metal gate and a high-K dielectric layer in a method for fabricating a semi-floating gate memory device according to an embodiment of the present application.
Figure 12:
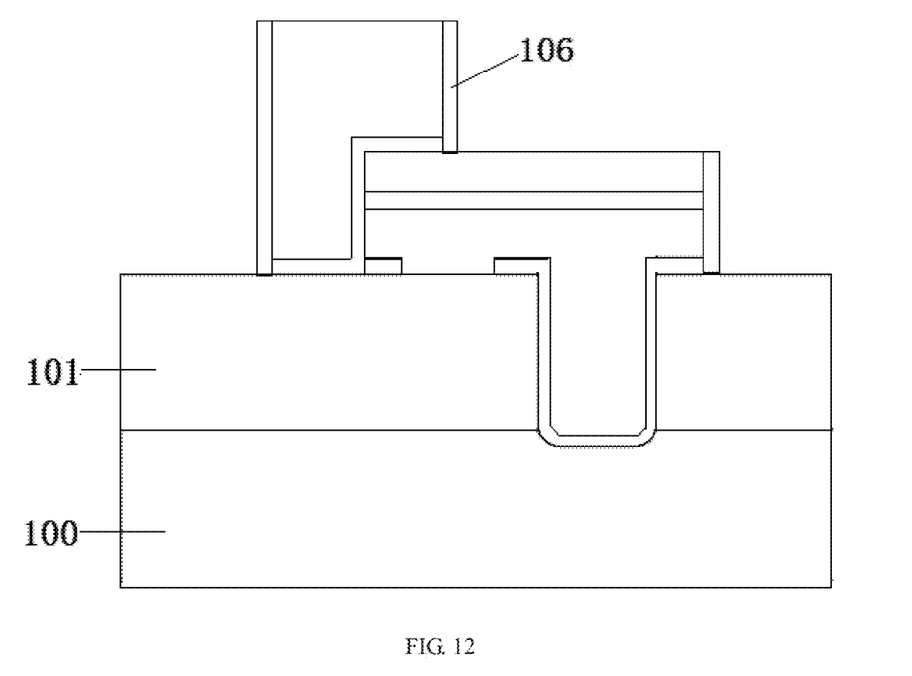
FIG. 12 illustrates a schematic diagram after forming a complete polysilicon control gate and spacer in a method for fabricating a semi-floating gate memory device according to an embodiment of the present application.

A method for fabricating the semi-floating gate memory device according to embodiment 1 or 2 is provided. The method fabricating the semi-floating gate memory device includes the following steps:

S1: forming a semi-floating gate well region 101 of a second doping type on a silicon substrate 100 of a first doping type, and etching the semi-floating gate well region 101 to form a U-shaped groove 102 connected to the silicon substrate 100, the first doping type being P-type and the second doping type being N-type, or the first doping type being N-type and the second doping type being P-type, as illustrated in FIG. 2;

S2: forming a floating gate dielectric layer 104 on a surface of the U-shaped groove 102 and an upper surface of the semi-floating gate well region 101, as illustrated in FIG. 3;

S3: etching the floating gate dielectric layer 104, forming an opening 105 connected to the semi-floating gate well region 101 on the floating gate dielectric layer 104 on a left side of the U-shaped groove 103, and exposing a part of the semi-floating gate well region 101, as illustrated in FIG. 4;

S4: depositing a floating gate polysilicon layer 103, performing a first doping type ion implantation and performing annealing for activation, as illustrated in FIG. 5;

S5: depositing a control gate oxide layer 110 and a control gate polysilicon layer 111 on the floating gate polysilicon 103, as illustrated in FIG. 6;

S6: performing etching to remove a vertical stack layer of the control gate polysilicon layer 111, the control gate oxide layer 110, the floating gate polysilicon layer 103 and the floating gate dielectric layer 104 outside a first set distance on the left side of the opening, and stopping at the semi-floating gate well region 101, as illustrated in FIG. 7;

S7: forming a high-K dielectric layer 112 on a wafer, as illustrated in FIG. 8;

S8: depositing a metal gate 113 on the high-K dielectric layer 112, as illustrated in FIG. 9;

S9: performing metal gate 113 Chemical-Mechanical Polishing (CMP), as illustrated in FIG. 10;

S10: performing etching to remove a vertical stack layer of the metal gate 113 and the high-K dielectric layer 112 outside a second set distance on the left side of the opening, and stopping at the semi-floating gate well region 101, the second set distance being greater than the first set distance; and performing etching to remove a vertical stack layer of the metal gate 113 and the high-K dielectric layer 112 on a right side of a left part of the opening, and stopping at the control gate polysilicon layer 111, as illustrated in FIG. 11;

S11: performing etching to remove a vertical stack layer of the control gate polysilicon layer 111, the control gate oxide layer 110, the floating gate polysilicon 103 and the floating gate dielectric layer 104 outside a third set distance on a right side of the U-shaped groove 102, and stopping at the semi-floating gate well region 101 to form a complete polysilicon control gate;

S12: forming gate spacer 106, as illustrated in FIG. 12;

S13: simultaneously performing silicon epitaxial growth on the control gate polysilicon layer 111, the semi-floating gate well region 101 outside the left spacer of the metal gate 113 and the semi-floating gate well region 101 outside the right spacer of the control gate polysilicon layer 111 to respectively form a control gate epitaxial silicon layer 114, a source region 107 and a drain region 108, as illustrated in FIG. 13.

The method for fabricating the semi-floating gate memory device according to embodiment 3 can be used to fabricate a double control gate semi-floating gate memory device with a high-K/metal gate and a silicon oxide/polysilicon gate. In the fabricated semi-floating gate memory device, a control gate epitaxial silicon layer 114, a source region 107 and a drain region 108 are formed by an epitaxial growth structure, separate source and drain ion implantation is not needed, the mask required for source and drain ion implantation is saved, and the fabrication cost is low.

Embodiment 4

Based on the method for fabricating the semi-floating gate memory device according to embodiment 3, in step S9, when the metal gate 113 Chemical-Mechanical Polishing (CMP) is performed, the stopped metal gate 113 is higher than the high-K dielectric layer 112.

Further, in step S9, when the metal gate 113 Chemical-Mechanical Polishing (CMP) is performed, the stopped metal gate 113 is 0.1 nm-50 nm higher than the high-K dielectric layer 112.

Further, in step S10, the second set distance is 1-100 nm larger than the first set distance, that is, the width of the metal gate 113 downwards extending to the top of the semi-floating gate well region 101 is 1-100 nm.

After etching is performed to remove a vertical stack layer of the metal gate 113 and the high-K dielectric layer 112 on a right side of a left part of the opening, the width of the metal gate 113 covering the control gate polysilicon layer 111 is 1-100 nm.

Further, in step S11, after etching is performed to remove a vertical stack layer of the control gate polysilicon layer 111, the control gate oxide layer 110, the floating gate polysilicon 103 and the floating gate dielectric layer 104 outside a third set distance on the right side of the U-shaped groove 102, the width of the control gate polysilicon layer 111 not covered by the metal gate 113 is 1-100 nm.

Further, the high-K gate dielectric layer 112 is one or a combination of any of ZrO$_2$, ZrON, ZrSiON, HfZrO, HfZrON, HfON, HfO$_2$, HfAlO, HfAlON, HfSiO, HfSiON, HfLaO and HfLaON;

The metal gate 113 is one or a combination of any of TiN, TaN, MON, WN, TaC and TaCN.

What are described above are only preferred embodiments of the present application and are not used to limit the present application. Any modification, equivalent replacement, improvement and the like made within the spirit and principle of the present application should be included in the scope of protection of the present application.

What is claimed is:

1. A semi-floating gate memory device, comprising a semi-floating gate well region of a second doping type being formed on a silicon substrate of a first doping type, the first doping type being P-type and the second doping type being N-type, or the first doping type being N-type and the second doping type being P-type, wherein a U-shaped groove connected to the silicon substrate is formed in the semi-floating gate well region;
    a floating gate polysilicon layer of the first doping type is filled into the U-shaped groove and above the semi-floating gate well region covering a periphery of the U-shaped groove;
    the floating gate polysilicon layer filled into the U-shaped groove is isolated from the semi-floating gate well region by a floating gate dielectric layer;
    the floating gate polysilicon layer above the semi-floating gate well region covering the periphery of the U-shaped groove is isolated from an upper surface of the semi-floating gate well region by the floating gate dielectric layer, and is in connective contact with the semi-floating gate well region through an opening in the floating gate dielectric layer covering the upper surface of the semi-floating gate well region on a left side of the U-shaped groove, wherein the left side comprises a side nearest a drain region to be formed;
    a control gate oxide layer covers an upper surface of the floating gate polysilicon layer;
    a control gate polysilicon layer covers an upper surface of the control gate oxide layer;
    a metal gate is located on a left part of the control gate polysilicon layer and downwards extends from a left side of the control gate polysilicon layer to an upper part of the semi-floating gate well region, and the metal gate is isolated from the control gate polysilicon layer and the semi-floating gate well region by a high-K dielectric layer;
    spacer is formed on the left side of the downwards extending part of the metal gate, the right side of the part of the metal gate above the control gate polysilicon layer, the right side of the control gate polysilicon layer, and the right side of the floating gate polysilicon layer;
    a source region and a drain region are respectively formed through silicon epitaxial growth on the semi-floating gate well region outside the left spacer of the metal gate and the semi-floating gate well region outside the right spacer of the control gate polysilicon layer; and
    a control gate epitaxial silicon layer is formed through silicon epitaxial growth on the control gate polysilicon layer,
    wherein a width of the metal gate downwards extending to a top of the semi-floating gate well region is 1-100 nm, and a width of the metal gate covering the control gate polysilicon layer is 1-100 nm,
    wherein a width of the control gate polysilicon layer not covered by the metal gate is 1-100 nm, a regional width of the control gate epitaxial silicon layer is 1-100 nm, and a width of the source region and the drain region formed through silicon epitaxial growth is 1-100 nm.

2. The semi-floating gate memory device according to claim 1, wherein the control gate epitaxial silicon layer is lower than an upper surface of the metal gate.

3. The semi-floating gate memory device according to claim 1, wherein the high-K dielectric layer is one or a combination of any of ZrO$_2$, ZrON, ZrSiON, HfZrO, HfZrON, HfON, HfO$_2$, HfAlO, HfAlON, HfSiO, HfSiON, HfLaO, and HfLaON, and the metal gate is one or a combination of any of TiN, TaN, MON, WN, TaC, and TaCN.

4. A method for fabricating the semi-floating gate memory device according to claim 1, comprising:
    S1: forming the semi-floating gate well region of the second doping type on the silicon substrate of the first doping type, and etching the semi-floating gate well region to form the U-shaped groove connected to the silicon substrate, the first doping type being P-type and the second doping type being N-type, or the first doping type being N-type and the second doping type being P-type;
    S2: forming the floating gate dielectric layer on the surface of the U-shaped groove and the upper surface of the semi-floating gate well region;
    S3: etching the floating gate dielectric layer, forming an opening connected to the semi-floating gate well region on the floating gate dielectric layer on the left side of the U-shaped groove, and exposing a part of the semi-floating gate well region;
    S4: depositing the floating gate polysilicon layer, performing a first doping type ion implantation and performing annealing for activation;
    S5: depositing the control gate oxide layer and the control gate polysilicon layer on the floating gate polysilicon layer;
    S6: performing etching to remove a vertical stack layer of the control gate polysilicon layer, the control gate oxide layer, the floating gate polysilicon layer and the floating gate dielectric layer outside a first set distance on the left side of the opening, and stopping at the semi-floating gate well region;
    S7: forming the high-K dielectric layer on a wafer;
    S8: depositing the metal gate on the high-K dielectric layer;
    S9: performing metal gate chemical-mechanical polishing;
    S10: performing etching to remove a vertical stack layer of the metal gate and the high-K dielectric layer outside a second set distance on the left side of the opening, and stopping at the semi-floating gate well region, the second set distance being greater than the first set distance; and performing etching to remove a vertical stack layer of the metal gate and the high-K dielectric layer on a right side of a left part of the opening, and stopping at the control gate polysilicon layer;
    S11: performing etching to remove a vertical stack layer of the control gate polysilicon layer, the control gate oxide layer, the floating gate polysilicon layer and the floating gate dielectric layer outside a third set distance on a right side of the U-shaped groove, and stopping at the semi-floating gate well region to form a complete polysilicon control gate;
    S12: forming a gate spacer; and S13: simultaneously performing silicon epitaxial growth on the control gate polysilicon layer, the semi-floating gate well region outside the left spacer of the metal gate, and the semi-floating gate well region outside the right spacer of the control gate polysilicon layer to respectivelyform the control gate epitaxial silicon layer, the source region, and the drain region.

5. The method for fabricating the semi-floating gate memory device according to claim 4, wherein, in step S9, when the metal gate chemical-mechanical polishing is performed, the stopped metal gate is higher than the high-K dielectric layer.

6. The method for fabricating the semi-floating gate memory device according to claim 4, wherein, in step S9, when the metal gate chemical-mechanical polishing is performed, the stopped metal gate is 0.1 nm-50 nm higher than the high-K dielectric layer.

7. The method for fabricating the semi-floating gate memory device according to claim 4, wherein, in step S10, the second set distance is 1-100 nm larger than the first set distance.

8. The method for fabricating the semi-floating gate memory device according to claim 4, wherein after etching is performed to remove the vertical stack layer of the metal gate and the high-K dielectric layer on the right side of the left part of the opening, the width of the metal gate covering the control gate polysilicon layer is 1-100 nm.

9. The method for fabricating the semi-floating gate memory device according to claim 4, wherein, in step S11, after etching is performed to remove the vertical stack layer of the control gate polysilicon layer, the control gate oxide layer, the floating gate polysilicon layer, and the floating gate dielectric layer outside the third set distance on the right side of the U-shaped groove, the width of the control gate polysilicon layer not covered by the metal gate is 1-100 nm.

10. The method for fabricating the semi-floating gate memory device according to claim 4, wherein the high-K dielectric layer is one or a combination of any of $ZrO_2$, ZrON, ZrSiON, HfZrO, HfZrON, HfON, $HfO_2$, HfAlO, HfAlON, HfSiO, HfSiON, HfLaO, and HfLaON, and the metal gate is one or a combination of any of TiN, TaN, MON, WN, TaC, and TaCN.

* * * * *